US010329661B2

(12) United States Patent
Linke et al.

(10) Patent No.: US 10,329,661 B2
(45) Date of Patent: Jun. 25, 2019

(54) CU—GA—IN—NA TARGET

(71) Applicant: PLANSEE SE, Reutte (AT)

(72) Inventors: Christian Linke, Ehenbichl (AT); Jiehua Li, Leoben (AT); Peter Schumacher, Leoben (AT); Wolfram Knabl, Reutte (AT); Gerhard Leichtfried, Reutte (AT)

(73) Assignee: Plansee SE, Reutte (AT)

( * ) Notice: Subject to any disclaimer, the term of this patent is extended or adjusted under 35 U.S.C. 154(b) by 970 days.

(21) Appl. No.: 14/764,007

(22) PCT Filed: Jan. 29, 2014

(86) PCT No.: PCT/AT2014/000016
§ 371 (c)(1),
(2) Date: Jul. 28, 2015

(87) PCT Pub. No.: WO2014/117190
PCT Pub. Date: Aug. 7, 2014

(65) Prior Publication Data
US 2015/0354055 A1    Dec. 10, 2015

(30) Foreign Application Priority Data
Jan. 31, 2013 (AT) .............................. GM26/2013 U

(51) Int. Cl.
*C23C 14/34* (2006.01)
*B22F 3/02* (2006.01)
(Continued)

(52) U.S. Cl.
CPC ............ *C23C 14/3414* (2013.01); *B22F 1/00* (2013.01); *B22F 3/02* (2013.01); *B22F 3/12* (2013.01); *B22F 9/04* (2013.01); *B22F 9/082* (2013.01); *C22C 1/0425* (2013.01); *C22C 1/0491* (2013.01); *C22C 9/00* (2013.01);
(Continued)

(58) Field of Classification Search
CPC .......... C23C 14/3414; B22F 3/02; B22F 3/12; B22F 9/082; B22F 1/00; C22C 30/02; C22C 24/00; H01J 37/3426; H01L 31/18
See application file for complete search history.

(56) References Cited

U.S. PATENT DOCUMENTS 7,717,987 B2    5/2010   Van Osten et al.
8,795,489 B2    8/2014   Zhang et al.
(Continued)

FOREIGN PATENT DOCUMENTS

CN    101195904 A    6/2008
CN    101260513 A    9/2008
(Continued)

OTHER PUBLICATIONS

Contreras et al., On the role of Na and modifications to Cu(In,Ga)Se2, absorber materials using Thin-MF (M=Na, K , Cs) precursor layers, 26th IEEE PVSC, Anaheim, California, Sep. 30-Oct. 3, 1997, pp. 359-362.

*Primary Examiner* — Jessee R Roe
(74) *Attorney, Agent, or Firm* — Laurence A. Greenberg; Werner H. Stemer; Ralph E. Locher

(57) ABSTRACT

A sputtering target is composed of an alloy consisting of 5 to 70 at % of at least one element from the group of (Ga, In) and 0.1 to 15 at % of Na, the remainder being Cu and typical impurities. The sputtering target includes at least one intermetallic Na-containing phase.

9 Claims, 2 Drawing Sheets

(51) Int. Cl.

| | | |
|---|---|---|
| *B22F 3/12* | (2006.01) | |
| *B22F 9/08* | (2006.01) | |
| *B22F 9/04* | (2006.01) | |
| *B22F 1/00* | (2006.01) | |
| *C22C 30/02* | (2006.01) | |
| *C22C 24/00* | (2006.01) | |
| *H01J 37/34* | (2006.01) | |
| *H01L 31/18* | (2006.01) | |
| *C22C 1/04* | (2006.01) | |
| *C22C 9/00* | (2006.01) | |
| *C22C 28/00* | (2006.01) | |
| *B22F 3/15* | (2006.01) | |
| *B22F 3/105* | (2006.01) | |

(52) U.S. Cl.
CPC .............. *C22C 24/00* (2013.01); *C22C 28/00* (2013.01); *C22C 30/02* (2013.01); *H01J 37/3426* (2013.01); *H01L 31/18* (2013.01); *B22F 3/15* (2013.01); *B22F 2003/1051* (2013.01); *B22F 2998/10* (2013.01)

(56) References Cited

U.S. PATENT DOCUMENTS

| | | |
|---|---|---|
| 2004/0063320 A1 | 4/2004 | Hollars |
| 2010/0258191 A1 | 10/2010 | Mackie |
| 2012/0018828 A1 | 1/2012 | Shao |
| 2012/0045360 A1 | 2/2012 | Matsumura et al. |
| 2013/0192986 A1 | 8/2013 | Morimoto et al. |
| 2014/0034491 A1 | 2/2014 | Zhang et al. |

FOREIGN PATENT DOCUMENTS

| | | |
|---|---|---|
| CN | 101613091 A | 12/2009 |
| CN | 101820024 A | 9/2010 |
| EP | 1932939 A1 | 6/2008 |
| EP | 2410556 A2 | 1/2012 |
| JP | 2011149039 A | 8/2011 |
| JP | 2012082498 A | 4/2012 |
| JP | 2013166976 A | 8/2013 |
| TW | 201114933 A | 5/2011 |
| TW | 201220522 A | 5/2012 |
| WO | 2011055537 A1 | 5/2011 |
| WO | 2011126092 A1 | 10/2011 |
| WO | 2012147985 A1 | 11/2012 |

CU—GA—IN—NA TARGET

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Field of the Invention

The invention relates to a sputtering target composed of an alloy consisting of 5 to 70 at % of at least one element from the group of (Ga, In) and 0.1 to 15 at % of Na, the remainder being Cu and typical impurities. The invention further relates to a process for producing a sputtering target and to the use thereof.

Photoactive layers for thin-film solar cells are produced via physical vapour deposition (PVD) processes. These are coating processes in which the layer formation takes place through vaporization of the layer-forming particles from a target and the condensation of this vapour on the substrate to be coated. The aim of the process is to deposit homogeneous layers having uniform layer thickness.

For photoactive layers produced in this way, for CIGS-based solar cells, sputtering targets composed of Cu—Ga, Cu—In and Cu—In—Ga are used. Such sputtering targets can be produced either by a melt metallurgy route or via the powder metallurgy production route.

Sputtering targets produced by melt metallurgy show the disadvantage of a coarse microstructure which leads to relief formation in the sputtering process through inhomogeneous erosion. This problem can be counteracted by a powder metallurgy production route. Sputtering targets produced by powder metallurgy show a very homogeneous, fine-grain microstructure which subsequently ensures homogeneous erosion in the course of sputtering and an optimized thin layer. The production of Cu—In—Ga sputtering targets by melt metallurgy is described, for example, in EP 1 932 939; the production of Cu—Ga sputtering targets by powder metallurgy is disclosed, for example, by WO 2011 126092.

The efficiency achievable in CIGS-based thin-film solar cells is increased by the addition of alkali metals, as known, for example, from Contreras et al., 26th *IEEE PVSC*, Anaheim, Calif., Sep. 30-Oct. 3 (1997) 359-362. In this context, particularly Na is found to be advantageous over K and Cs. According to general literature understanding, the increase in the efficiency is based on an increase in the p-type conductivity in the CIGS layer and, as a result, in the open-circuit voltage.

Alkali metal atoms can be introduced into the CIGS layer of the thin-film solar cell via the introduction of alkali metal salts or organic compounds into a target used for deposition of the layer (US 2010 0258191, EP 2 410 556, WO 2011 055537). These targets are, for example, Cu—Ga targets having an appropriate proportion of an organic alkali metal compound or of an alkali metal salt.

A disadvantage of such an introduction of alkali metal atoms is contamination by the organic constituents used or cations of the salts used, which subsequently leads to a reduction in the homogeneity of the microstructure and in the density of the target. This also reduces the quality of the deposited layer, and the desired optimal sputtering outcome is not achieved. Moreover, the relatively low chemical stability of such alkali metal compounds leads to material losses during the production process, and accordingly to variations in the composition of the sputtering targets thus produced. Subsequently, unwanted and performance-reducing inhomogeneities also arise in layers deposited with such sputtering targets. The processing and storage of sputtering targets produced via the introduction of organic constituents and/or salts harbours further disadvantages. For example, the hygroscopic properties of the salts introduced can cause an increased corrosion tendency of the target; consequently, targets produced in this way can only be processed dry.

BRIEF SUMMARY OF THE INVENTION

The objective of the invention is to produce a sputtering target from a Cu—Ga—Na, a Cu—In—Na or a Cu—Ga—In—Na alloy with avoidance of the disadvantages mentioned. More particularly, an inventive sputtering target having high purity is to be provided, which has a homogeneous and fine-grain microstructure. The inventive sputtering target is to be producible inexpensively, have good processability and be easy to handle, and be achievable without the addition of organic compounds or salts.

The object is achieved through the independent claims. Advantageous configurations are apparent from the dependent claims.

It is a feature of the inventive sputtering target composed of an alloy consisting of 5 to 70 at % of at least one element from the group of (Ga, In) and 0.1 to 15 at % of Na, the remainder being Cu and typical impurities, that it comprises at least one intermetallic Na-containing phase. Through the introduction of at least one intermetallic Na-containing phase, the use of salts or organic compounds as a Na carrier is preferably dispensed with completely. This increases the purity of the sputtering target and as a result also improves the sputtering result.

The term "intermetallic phases" refers to phases which occur in binary, ternary or else multicomponent systems, the range of existence of which does not continue as far as the pure components. They frequently have crystal structures different from the crystal structures of the pure components, and proportions of nonmetallic bonding types. Intermetallic phases are characterized particularly by a composition of inexact (meaning not directly corresponding to the valencies of the pure components) valency and a finite homogeneity region. Intermetallic phases frequently have a high strength and good corrosion resistance.

Typical impurities refer to production-related impurities of gases or accompanying elements which originate from the raw materials used. The proportion of such impurities in an inventive sputtering target is in the region of below 1000 ppm for gases, and below 500 ppm for other elements.

The at least one Na-containing intermetallic phase in the inventive sputtering target is preferably from the group of the intermetallic Ga—Na phases, the intermetallic In—Na phases or the intermetallic Ga—In—Na phases. These phases should be used with preference, since they enable favourable production conditions via the melt metallurgy route because of their melting points below about 550° C.

The at least one Na-containing intermetallic phase in the inventive sputtering target is preferably from the group of $NaGa_4$, $Na_5Ga_8$, $Na_7Ga_{13}$, $Na_{22}Ga_{39}$, $NaIn$, $Na_2In$, $Na_7In_{12}$, $Na_{15}In_{27}$ and $Na_{17}Ga_{29}In_{12}$, and it is also possible to use further binary intermetallic Ga—Na phases, In—Na phases, ternary intermetallic Ga—In—Na phases and intermetallic inequilibrium phases composed of the systems Ga—Na, In—Na and Ga—In—Na, the chemical composition of which may be subject to a small natural variation. All these intermetallic phases are characterized in that they have a narrow stoichiometric composition. In addition, the naturally strong bonds of intermetallic phases ensure that only small Na losses occur during the production process. Accordingly, the Na content desired in the sputtering target can be set accurately.

The occurrence of intermetallic phases in the microstructure of the inventive sputtering target can be detected in a very simple manner by means of X-ray diffractometry using the JCPDS cards for the respective intermetallic phases.

The effect of the Na-containing intermetallic phase is particularly advantageous when it is present embedded in the microstructure of the sputtering target, distributed homogeneously in a matrix of at least one element from the group of (Cu, Ga, In). Also advantageous is an approximately globular form of the Na-containing intermetallic phase present. By virtue of a microstructure with such a configuration, the Na distribution is homogeneous over the entire sputtering target, and subsequently also leads to an optimized Na distribution in the layer produced therewith. The approximately globular form of the intermetallic phases has a positive effect on the toughness of the sputtering target, since only a low notch effect is exerted thereby. Phases in globular form are defined here as three-dimensionally approximately spherical particles having an aspect ratio of 0.7 to 1.3 in at least one two-dimensional section, for example at a ground face.

A further positive effect on the sputtering characteristics of the inventive sputtering target is given by a size of the intermetallic phases between 1 and 500 µm, preferably between 1 and 200 µm. By virtue of this fine granularity of the intermetallic phases, homogeneous erosion without relief formation is ensured in the course of sputtering. This effect is manifested particularly advantageously in the case of a size of the intermetallic phases between 1 and 50 µm.

The inventive sputtering target further has a relative density of more than 90%. An even higher relative density of more than 96% is particularly advantageous. Preference is further given to a relative density of more than 98%. The higher the density of the target, the more advantageous are the properties thereof. Below a relative density of 96%, a partly open-pore microstructure is present, which can be a virtual leak and/or source of impurities and particles. In addition, targets having low density have a tendency to take up water and other impurities, the result of which can be poor controllability of process parameters.

As is well known, the relative density can be determined in a simple manner via the archimedean principle by means of buoyancy methods.

The inventive sputtering target preferably has a Cu content of more than 30 at %. Cu contents up to 94.5 at % are possible in embodiments of the invention. Cu contents of less than 30 at % lead to a greatly reduced toughness of the sputtering target, which makes it difficult to handle in production processing and on the part of the customer.

In embodiments of the invention which comprise both Ga and In, the preferred Cu content is between 30 and 50 at %. Through sputtering of an inventive sputtering target having Cu contents within this range, it is possible to obtain CIGS layers having particularly advantageous properties.

The content of the at least one element from the group of (Ga, In) in an inventive sputtering target is between 5 and 70 at %, in preferred embodiments between 20 and 65 at %. At contents above 70 at %, problem-free handling is no longer assured because the toughness is too low and the melting point of Cu—Ga phases which occur is additionally low; below 5 at %, it is no longer possible to produce a layer having favourable photoactive properties through sputtering of the sputtering target. A restriction to below 65 at % improves the handling further. The reason for the additionally advantageous restriction to contents of the at least one element from the group of (Ga, In) of at least 20 at % is that the technical functionality of photoactive layers produced by means of sputtering of the inventive sputtering target can thus be optimized.

In embodiments of the invention which contain both Ga and In, a ratio in at % of the constituents Ga/(Ga+In) between 0.15 and 0.35 is found to be particularly advantageous. In the case of a ratio of the constituents Ga/(Ga+In) less than 0.15, there can be an unfavourable influence on the stoichiometry which is necessary for an optimal functionality in the photoactive layer produced by means of sputtering of the sputtering target. Ga/(Ga+In) ratios of greater than 0.35 lead to reduced toughness of the sputtering target.

The preferred Na content of the inventive sputtering target is between 0.1 and 15 at %. It is thus possible with preference to introduce between 0.1 and 3 at % of Na into the photoactive layer deposited by means of sputtering and, as a result, to significantly increase the efficiency of the thin-film solar cell thus generated. This effect is optimized by a preferred Na content of the inventive sputtering target between 1 and 5 at %.

The envisaged use for deposition of photoactive layers for thin-film solar cells in different manufacturing plants and for different geometries of the substrates to be coated makes various geometric demands on an inventive sputtering target. Accordingly, such a target may be in the form of a plate, a disc, a rod, a tube or another body of complex shape. Such a body of complex shape may have, for example, the shape of a cup or of a hollow cathode.

An inventive sputtering target can be produced via the powder metallurgy route, which goes through the provision of a powder mixture and subsequent compaction.

It is found to be particularly advantageous here when a process for producing an inventive sputtering target comprises the following step:
  producing a preliminary alloy powder comprising at least one Na-containing intermetallic phase.

The production of a preliminary alloy powder comprising at least one Na-containing intermetallic phase ensures that the Na content of the sputtering target can be set accurately. This firstly results from the narrow stoichiometric composition of the intermetallic phases used, and also from the high bond strength of intermetallic phases which prevents Na losses both in the course of production and in the course of use of the sputtering target.

The production of the preliminary alloy powder comprising at least one Na-containing intermetallic phase can be performed by atomization of a Ga—Na, an In—Na or a Ga—In—Na melt. The alloys produced by melt metallurgy preferably have melting points of <550° C. and can thus be produced by conventional gas atomization processes. After the atomization, the preliminary alloy powder is present in powder particle sizes preferably between 1 and 100 µm and in approximately spherical form. The preliminary alloy powder can, after the atomization, subsequently be sieved, sifted, classified and/or comminuted further.

The preliminary alloy powder comprising at least one Na-containing intermetallic phase can alternatively also be produced by producing an ingot from a Ga—Na, an In—Na or a Ga—In—Na melt and subsequent comminution and/or grinding. The low toughness of intermetallic phases ensures a good grinding outcome with a narrow distribution of the resulting powder particle size of the preliminary alloy powder.

An inventive preliminary alloy powder is characterized in that it comprises at least one Na-containing intermetallic phase. This intermetallic phase is preferably from the group of the intermetallic Ga—Na phases, the intermetallic In—Na phases or the intermetallic Ga—In—Na phases. These phases should be used with preference because their melting points below about 550° C. enable favourable production conditions for the preliminary alloy powder via the melt metallurgy route. Further preferably, the intermetallic phase in the inventive preliminary alloy powder is from the group of $NaGa_4$, $Na_5Ga_8$, $Na_7Ga_{13}$, $Na_{22}Ga_{39}$, $NaIn$, $Na_2In$, $Na_7In_{12}$, $Na_{15}In_{27}$ and $Na_{17}Ga_{29}In_{12}$, and it is also possible to use further binary intermetallic Ga—Na phases, In—Na phases, ternary intermetallic Ga—In—Na phases and intermetallic inequilibrium phases composed of the systems Ga—Na, In—Na and Ga—In—Na, the chemical composition of which may be subject to a small natural variation. All these intermetallic phases are characterized in that they have a narrow stoichiometric composition. In addition, the naturally strong bonds in intermetallic phases ensure that only small Na losses occur during the production process. Accordingly, the Na content desired in the preliminary alloy powder can be set accurately.

The occurrence of these intermetallic phases in an inventive preliminary alloy powder can be detected very easily by means of X-ray diffractometry using the JCPDS cards for the respective intermetallic phases.

In embodiments of the invention, the preliminary alloy powder comprising at least one Na-containing intermetallic phase may preferably consist completely of Na-containing intermetallic phase.

An inventive preliminary alloy powder is preferably used for production of a sputtering target.

The process for producing an inventive sputtering target preferably comprises the following further steps:
producing a powder mixture comprising the preliminary alloy powder
introducing the powder mixture into a mould.

A powder mixture comprising the preliminary alloy powder is achieved by the mixing of the preliminary alloy powder with appropriate amounts of powders containing Ga, In and Cu. Thus, a chemical composition of the inventive sputtering target can be set in an accurate and uncomplicated manner. By virtue of dispensing with organic compounds and salts, losses during the production process, which arise through the decomposition of these compounds, are very substantially avoided. It is thus possible in a more efficient manner to introduce relatively high Na contents into the sputtering target produced. Subsequently, the higher stability of the intermetallic Na-containing phases also substantially avoids losses during the use of the sputtering target in sputtering, and reduces inhomogeneities and impurities in a layer produced with a sputtering target produced in accordance with the invention by sputtering. The handling, processing and storage of the inventive sputtering target are also distinctly improved by the reduced tendency to corrosion.

The powder mixture produced in such a way is filled into a mould. A mould here refers either to the die or the hose of a cold isostatic press, of a hot press or of a spark plasma sintering system, or else the can of a hot isostatic press.

The process for producing an inventive sputtering target preferably comprises the further following step:

compacting the powder mixture by the application of pressure, temperature, or pressure and temperature, to give a blank.

The powder mixture filled into a mould is compacted by the application of pressure, temperature, or pressure and temperature, to a blank. This can be done by process steps of varying configuration, for example by pressing and sintering, hot pressing, cold isostatic pressing, hot isostatic pressing or spark plasma sintering (SPS), or a combination thereof.

The process for producing an inventive sputtering target preferably comprises the further following step:
forming the blank, for example by extrusion, forging or rolling.

The blank obtained can subsequently be formed in order possibly to produce advantageous properties, for example an increase in the density and/or further homogenization of the microstructure. Suitable processes for forming include, for example, rolling, forging or extruding.

The process for producing an inventive sputtering target preferably further comprises the following step:
heat treatment.

Both after compaction by pressure, temperature, or pressure and temperature, and after any forming step performed, heat treatment of the blank may be advantageous. According to the chemical composition of the sputtering target, the temperatures employed may be within a preferred range from 50 to 500° C.; equally, the effect of such a heat treatment may go from an exclusive dissipation of stresses as far as changes in microstructure through movement of small- and/or large-angle grain boundaries. The occurrence of phase transitions can also be achieved through such a heat treatment.

The process for producing an inventive sputtering target preferably further comprises the following step:
mechanical processing.

In order to achieve the desired final geometry and surface quality of the inventive sputtering target, mechanical processing steps can additionally be effected, for example machining, grinding, polishing. These processing steps can be configured either as dry or wet processing steps through the avoidance of salts and organic compounds in the production process.

The inventive target can additionally be applied by means of a bonding process, especially soldering, adhesive bonding or other bonding, to at least one support element, especially in the form of a sheet or of a tube.

The invention is illustrated in detail hereinafter with reference to production examples and figures.

WORKING EXAMPLES

Figure 1:
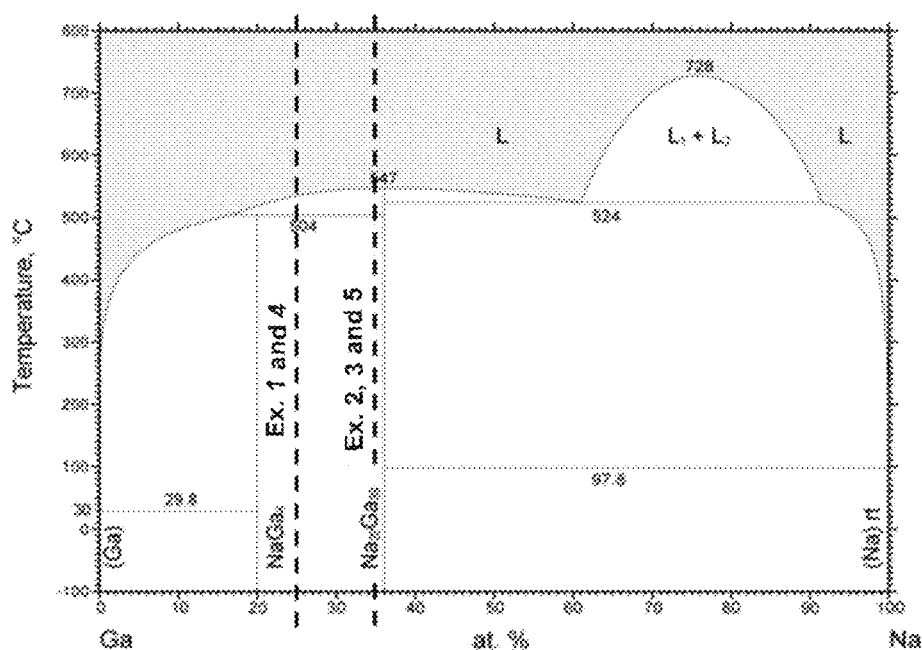
FIG. 1 is a phase diagram of the Ga-Na system [ASM Phase Diagrams Center, Diagram No. 103346]; compositions of the preliminary alloy powders of Examples 1 to 5 marked.
Figure 2:
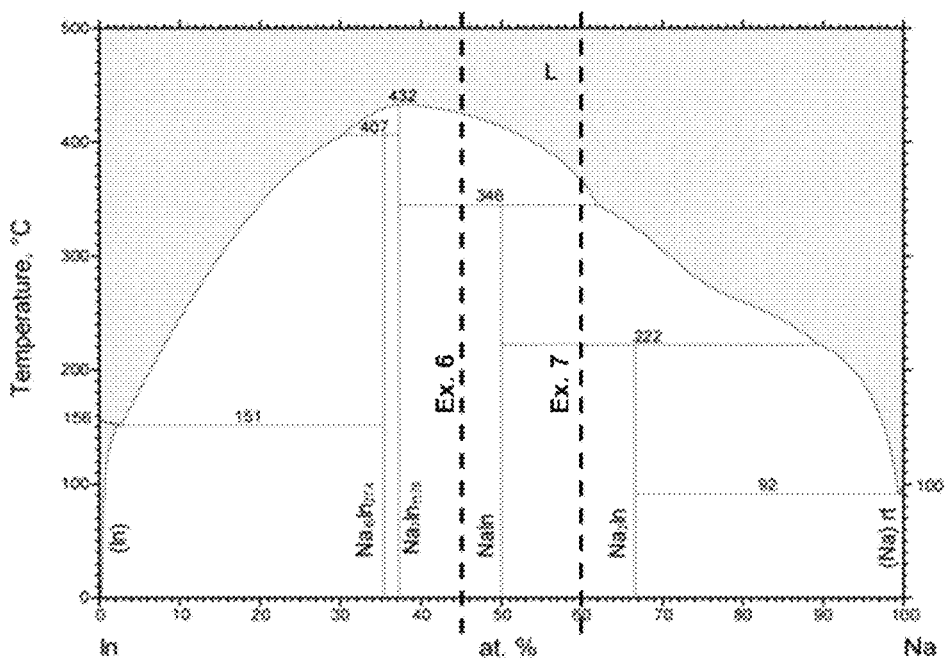
FIG. 2 is a phase diagram of the In-Na system [ASM Phase Diagrams Center, Diagram No. 903718]; compositions of the preliminary alloy powders of Examples 6 and 7 marked.
Figure 3:
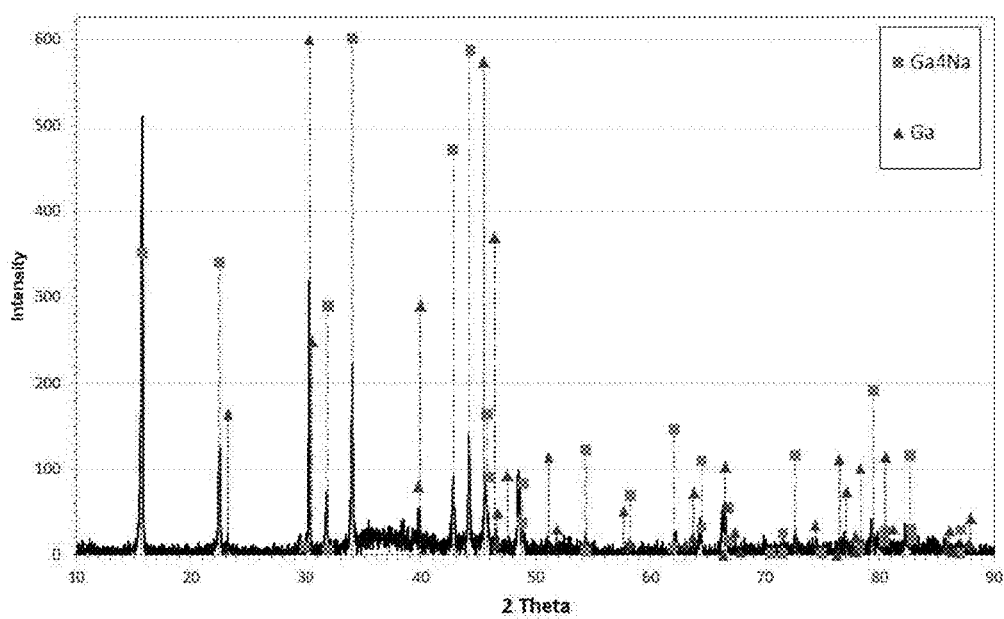
FIG. 3 is an X-ray diffractogram for Example 3, JCPDS cards used for Ga Number 03-065-2492, for $Ga_4N$ Number 00-043-1375.

The working examples are summarized in Table 1.

TABLE 1

| Example | Cu | Ga | In [at %] | Na | Powder route | Compaction | Form/target |
|---|---|---|---|---|---|---|---|
| 1 | 72 | 27 | 0 | 1 | Ga/Na 75/25, melting at 200° C., casting at 600° C., ingot; Cu/Ga powder 75/25 | Uniaxial hot press, 400° C. | Disc, 5 mm, 100 mm |
| 2 | 64 | 31 | 0 | 5 | Ga/Na 65/35, melting at 200° C., casting at 600° C., ingot; Cu/Ga powder 75/25 | Degas can at 300° C., HIP at 450° C. and 100 MPa | Tube, 155/135 × 250 mm |
| 3 | 68 | 31 | 0 | 1 | Ga/Na 65/35, melting at 200° C., atomizing at 600° C., Cu/Ga powder 70/30 | SPS hot press 400° C. | Disc, 5 mm, 100 mm |
| 4 | 40 | 15 | 40 | 5 | Ga/Na 75/25, melting at 200° C., casting at 600° C., ingot; Cu/In powder 50/50 | CIP | Disc, 5 mm, 100 mm |
| 5 | 73 | 26 | 0 | 1 | Ga/Na 65/35, melting at 200° C., casting at 600° C., ingot; Cu/Ga powder 75/25 | Degas can at 300° C., HIP at 450° C. and 100 MPa | Cylindrical, 10 × 50 mm extrusion press, 100 mm two-part disc |
| 6 | 78 | 0 | 21 | 1 | In/Na 55/45, melting at 300° C., casting at 500° C., ingot; Cu/In powder 80/20 | Uniaxial hot press, 400° C. | Disc, 5 mm, 100 mm |
| 7 | 64 | 0 | 31 | 5 | In/Na 40/60, melting at 300° C., atomizing at 500° C.; Cu/In powder 70/30 | Evacuate, HIP at 400° C. and 100 MPa | Tube, 155/135 × 250 mm |
| 8 | 41 | 17 | 37 | 5 | Ga/In/Na 50/20/30, melting at 250° C., casting at 550° C.; ingot; Cu/In/Ga powder | SPS hot press 400° C. | Disc, 5 mm, 100 mm |
| 9 | 42 | 8 | 45 | 5 | Ga/In/Na 50/20/30, melting at 250° C., casting at 550° C.; ingot; Cu/In powder 50/50 | Evacuate, HIP at 450° C. and 100 MPa | Tube, 155/135 × 250 mm |

Example 1

1 kg of Ga were heated to 200° C. and melted in a graphite crucible by means of induction heating. Subsequently, 0.1 kg of Na was added (ratio in at % Ga/Na=75/25). The temperature was subsequently increased to 600° C. After complete melting, the alloy was cast in a die made from hot-work steel.

After solidification, the ingot thus produced was removed and, after complete cooling, comminuted with the aid of a jaw crusher and a cross-beater mill.

Thereafter, the Ga—Na preliminary alloy powder thus obtained was screened off to a size of <500 μm and mixed with gas-atomized Cu—Ga alloy powder (Ga content 25 at %), such that an Na content of 1 at % was established.

The Cu—Ga—Na powder mixture thus obtained was compacted to a disc in a uniaxial hot press at a temperature of 400° C. and then processed to completion to give a sputtering target having a thickness of 5 mm and a diameter of 100 mm.

Example 2

5 kg of Ga were heated to 200° C. and melted in a graphite crucible by means of induction heating. Subsequently, 0.9 kg of Na was added (ratio in at % Ga/Na=65/35). The temperature was subsequently increased to 600° C. After complete melting, the alloy was cast in a die made from hot-work steel.

After solidification, the ingot thus produced was removed and, after complete cooling, comminuted with the aid of a jaw crusher and a cross-beater mill.

Thereafter, the Ga—Na preliminary alloy powder thus obtained was screened off to a size of <500 μm and mixed with gas-atomized Cu—Ga alloy powder (Ga content 25 at %), such that an Na content of Sat % was established.

The Cu—Ga—Na powder mixture thus obtained was introduced into a tubular steel capsule, hot-degassed at 300° C. and sealed airtight. The powder was compacted by means of hot isostatic pressing at a temperature of 450° C., a pressure of 100 MPa.

The blank thus obtained was subsequently processed by means of mechanical turning to give a tubular sputtering target of 155/135×250 mm.

Example 3

5 kg of Ga were heated to 200° C. in an Ar protective gas atmosphere and melted in a graphite crucible by means of induction heating. Subsequently, 0.9 kg of Na was added (ratio in at % Ga/Na=65/35). In the course of this, the temperature was increased to 600° C. After the alloy had melted completely, atomization was effected by means of Ar gas to a spherical preliminary alloy powder.

Subsequently, the preliminary alloy powder thus obtained was mixed with likewise gas-atomized Cu—Ga alloy powder (Ga content 30 at %) to give a Cu—Ga—Na powder mixture having an Na content of 1 at %.

The Cu—Ga—Na powder mixture thus obtained was compacted in a uniaxial hot press by means of spark plasma sintering (SPS) at a temperature of 400° C. to give a disc, and then processed to completion to give a disc-shaped sputtering target having a thickness of 5 mm and a diameter of 100 mm.

Example 4

1 kg of Ga was heated to 200° C. and melted in a graphite crucible by means of induction heating. Subsequently, 0.1 kg of Na was added (ratio in at % Ga/Na=75/25). The temperature was subsequently increased to 600° C. On completion of melting, the alloy was cast in a die made from hot-work steel.

After solidification, the ingot thus produced was removed and, after complete cooling, comminuted with the aid of a jaw crusher and a cross-beater mill.

Subsequently, the Ga—Na preliminary alloy powder thus obtained was screened off to <500 μm and mixed with gas-atomized Cu—In alloy powder (ratio in at % Cu/In=50/50) to give a powder mixture having an Na content of 5 at %.

The Cu—Ga—In—Na powder mixture thus obtained was subsequently compacted on a 3000 t press uniaxially at room temperature to give a disc-shaped blank. The blank thus obtained was subsequently processed to completion to give a sputtering target having a thickness of 5 mm and a diameter of 100 mm.

Example 5

5 kg of Ga were heated to 200° C. and melted in a graphite crucible by means of induction heating. Subsequently, 0.9 kg of Na was added (ratio in at % Ga/Na=65/35). In the course of this, the temperature was increased to 600° C. On completion of melting, the alloy was cast in a die made from hot-work steel.

After solidification, the ingot thus produced was removed and, after complete cooling, comminuted with the aid of a jaw crusher and a cross-beater mill.

Subsequently, the Ga—Na preliminary alloy powder thus obtained was screened off to a particle size of <500 μm and mixed with gas-atomized Cu—Ga alloy powder (Ga content 25 at %) to give a powder mixture having an Na content of 1 at %.

The Cu—Ga—Na powder mixture thus obtained was introduced into a cylindrical steel capsule, hot-degassed at 300° C. and sealed air tight. The powder was compacted by means of hot isostatic pressing (HIP) at a temperature of 450° C. and a pressure of 100 MPa.

The cylindrical blank thus obtained was subsequently separated from the steel can by means of mechanical turning and processed to a diameter of 60 mm and a length of 70 mm.

The cylindrical blank was subsequently heated to 800° C. in a push-through furnace and extruded with a 100 t extrusion press to give a 10×50 mm rectangular profile. This was used to manufacture a two-part target having a diameter of 100 mm.

Example 6

5 kg of In were heated to 300° C. and melted in a graphite crucible by means of induction heating. Subsequently, 0.8 kg of Na was added (ratio in at % In/Na=55/45). In the course of this, the temperature was increased to 500° C. On completion of melting, the alloy was cast in a die made from hot-work steel.

After solidification, the ingot thus produced was removed and, after complete cooling, comminuted with the aid of a jaw crusher and a cross-beater mill.

Subsequently, the In—Na preliminary alloy powder thus obtained was screened off to a particle size of <500 μm and mixed with gas-atomized Cu—In alloy powder (In content 20 at %) to give a powder mixture having an Na content of 1 at %.

The Cu—In—Na powder mixture thus obtained was compacted to a disc in a uniaxial hot press at a temperature of 400° C., and then processed to completion to give a sputtering target having a thickness of 5 mm and a diameter of 100 mm.

Example 7

5 kg of In were heated to 300° C. and melted in an Ar protective gas atmosphere in a graphite crucible by means of induction heating. Subsequently, 1.15 kg of Na were added (ratio in at % In/Na=40/60). In the course of this, the temperature was increased to 500° C. On completion of melting of the alloy, atomization was effected by means of Ar gas to give a spherical preliminary alloy powder.

Subsequently, the preliminary alloy powder thus obtained was mixed with likewise gas-atomized Cu—In alloy powder (In content 30 at %) to give a Cu—In—Na powder mixture having an Na content of 5 at %.

The Cu—In—Na powder mixture thus obtained was introduced into a tubular steel capsule, evacuated and sealed air tight. The powder was compacted by means of hot isostatic pressing at a temperature of 400° C. and a pressure of 100 MPa.

The blank thus obtained was subsequently processed by means of mechanical turning to give a tubular sputtering target of 155/135×250 mm.

Example 8

5.5 kg of Ga and 3.5 kg of In were heated to 250° C. and melted in a graphite crucible by means of induction heating. Subsequently, 0.1 kg of Na was added (ratio in at % Ga/In/Na=50/20/30). In the course of this, the temperature was increased to 550° C. On completion of melting, the alloy was cast in a die made from hot-work steel.

After solidification, the ingot thus produced was removed and, after complete cooling, comminuted with the aid of a jaw crusher and a cross-beater mill.

Subsequently, the Ga—In—Na preliminary alloy powder thus obtained was screened off to a particle size of <500 μm and mixed with gas-atomized Cu—In—Ga alloy powder (Ga content 10 at %, In content 40 at %) to give a powder mixture having an Na content of 5 at %.

The Cu—Ga—In—Na powder mixture thus obtained was compacted to a disc in a uniaxial hot press by means of spark plasma sintering (SPS) at a temperature of 400° C., and then processed to completion to give a disc-shape sputtering target having a thickness of 5 mm and a diameter of 100 mm.

Example 9

5.5 kg of Ga and 3.5 kg of In were heated to 250° C. and melted in a graphite crucible by means of induction heating. Subsequently, 0.1 kg of Na was added (ratio in at % Ga/In/Na=50/20/30). In the course of this, the temperature was increased to 550° C. On completion of melting, the alloy was cast in a die made from hot-work steel.

After solidification, the ingot thus produced was removed and, after complete cooling, comminuted with the aid of a jaw crusher and a cross-beater mill.

Subsequently, the Ga—In—Na preliminary alloy powder thus obtained was screened off to a particle size of <500 μm and mixed with gas-atomized Cu—In alloy powder (In content 50 at %) to give a powder mixture having an Na content of 5 at %.

The Cu—Ga—In—Na powder mixture thus obtained was introduced into a tubular steel capsule, evacuated and sealed air tight. The powder was compacted by means of hot isostatic pressing at a temperature of 450° C. and a pressure of 100 MPa.

The blank thus obtained was subsequently processed by means of mechanical turning to give a tubular sputtering target of 155/135×250 mm.

The invention claimed is:

1. A sputtering target, comprising an alloy consisting of 5 to 70 at % of at least one element selected from the group consisting of Ga and In, and 0.1 to 15 at % of Na, and a remainder Cu and impurities, and the sputtering target containing at least one Na-containing intermetallic phase.

2. The sputtering target according to claim 1, wherein said at least one Na-containing intermetallic phase is selected from the group consisting of the intermetallic Ga—Na phases, the intermetallic In-Na phases and the intermetallic Ga—In—Na phases.

3. The sputtering target according to claim 1, wherein said at least one Na-containing intermetallic phase is selected from the group consisting of $NaGa_4$, $Na_5Ga_8$, $Na_7Ga_{13}$, $Na_{22}Ga_{39}$, NaIn, $Na_2In$, $Na_7In_{12}$, $Na_{15}In_{27}$ and $Na_{17}Ga_{29}In_{12}$.

4. The sputtering target according to claim 1, wherein said Na-containing intermetallic phase is present embedded in homogeneous distribution in a matrix of at least one element selected from the group consisting of Cu, Ga and In.

5. The sputtering target according to claim 1, wherein said remainder Cu amounts to more than 30 at % of Cu.

6. The sputtering target according to claim 1, wherein a content of said at least one element selected from the group consisting of Ga and In amounts to between 20 and 65 at %.

7. The sputtering target according to claim 1, wherein a ratio in at % of the constituents Ga/(Ga+In) lies between 0.15 and 0.35.

8. The sputtering target according to claim 1, containing between 1 and 5 at % Na.

9. The sputtering target according to claim 1, wherein the sputtering target is formed as a plate, a disc, a rod, a tube, or a body of complex shape.

* * * * *